United States Patent
Murakami et al.

(10) Patent No.: US 8,106,506 B2
(45) Date of Patent: Jan. 31, 2012

(54) ELECTRONIC COMPONENT

(75) Inventors: Yukihiro Murakami, Tokyo (JP);
Yoshihiko Satoh, Tokyo (JP); Katsunari Moriai, Tokyo (JP); Kazuto Takeya, Tokyo (JP); Satoshi Kurimoto, Tokyo (JP)

(73) Assignee: TDK Corporation, Tokyo (JP)

( * ) Notice: Subject to any disclaimer, the term of this patent is extended or adjusted under 35 U.S.C. 154(b) by 441 days.

(21) Appl. No.: 12/406,688

(22) Filed: Mar. 18, 2009

(65) Prior Publication Data
US 2010/0071949 A1    Mar. 25, 2010

(30) Foreign Application Priority Data
Mar. 28, 2008   (JP) ................... P2008-086667

(51) Int. Cl.
*H01L 23/34* (2006.01)
*H01L 23/48* (2006.01)
(52) U.S. Cl. .. 257/724; 257/730; 257/737; 257/E23.021
(58) Field of Classification Search .................. 257/724, 257/737, 730, E23.021
See application file for complete search history.

(56) References Cited

U.S. PATENT DOCUMENTS

| | | | | |
|---|---|---|---|---|
| 4,660,017 | A | * | 4/1987 | Momoki et al. ................ 338/21 |
| 5,684,677 | A | * | 11/1997 | Uchida et al. ................. 361/770 |
| 5,757,263 | A | * | 5/1998 | Ravindranathan ............. 338/21 |
| 5,901,046 | A | * | 5/1999 | Ohta et al. ..................... 361/760 |
| 6,214,685 | B1 | * | 4/2001 | Clinton et al. ................ 438/382 |
| 6,285,085 | B1 | * | 9/2001 | Taguchi ......................... 257/780 |
| 6,310,757 | B1 | * | 10/2001 | Tuzuki et al. .............. 361/308.1 |
| 6,525,395 | B1 | * | 2/2003 | Kawase et al. ................. 257/528 |
| 6,729,003 | B2 | * | 5/2004 | Yokoyama et al. .......... 29/25.41 |
| 6,787,884 | B2 | * | 9/2004 | Hirano et al. ................. 257/618 |
| 2007/0133147 | A1 | * | 6/2007 | Ritter et al. ................ 361/306.3 |

FOREIGN PATENT DOCUMENTS

JP    A-10-12668    1/1998

* cited by examiner

*Primary Examiner* — Nitin Parekh
(74) *Attorney, Agent, or Firm* — Oliff & Berridge, PLC

(57) ABSTRACT

An electronic component has an element body, and a plurality of external electrodes formed on one principal face of the element body. Each external electrode has a first electrode layer joined to the one principal face of the element body, and a second electrode layer joined as laid on an inside region inside an edge of the first electrode layer. An apical surface of the second electrode layer is planar. A joint portion in the second electrode layer to the first electrode layer is rounded.

4 Claims, 4 Drawing Sheets

(a)

(b)

ELECTRONIC COMPONENT

BACKGROUND OF THE INVENTION

1. Field of the Invention

The present invention relates to an electronic component with external electrodes on one principal face of an element body.

2. Related Background Art

There is a known conventional electronic component in which a plurality of connection pads are formed on a lower face of a chip body and in which a gold bump is formed through an underlying metal layer under an exposed surface of each connection pad, for example, as described in Japanese Patent Application Laid-open No. 10-12668).

SUMMARY OF THE INVENTION

However, the foregoing conventional technology has the following problem. Namely, if solder is used to join the gold bumps to corresponding gold bumps on a circuit board in order to simply and inexpensively mount the electronic component on the circuit board, the solder can fail to fully wrap around a joint portion of each gold bump, so as to result in insufficient adhesion strength between the electronic component and the circuit board.

An object of the present invention is to provide an electronic component improved in adhesion strength in mounting on a circuit board.

The present invention provides an electronic component comprising: an element body; and a plurality of external electrodes formed on one principal face of the element body, wherein each external electrode has a first electrode layer joined to the one principal face of the element body, and a second electrode layer joined as laid on an inside region inside an edge of the first electrode layer, wherein an apical surface of the second electrode layer is planar, and wherein a joint portion in the second electrode layer to the first electrode layer is rounded.

For mounting the electronic component of this kind on a circuit board, the external electrodes of the electronic component are joined to corresponding conductors on the circuit board with solder. When the second electrode layer of each external electrode is laid on the inside region inside the edge of the first electrode layer, a contact area between the external electrode and solder increases by virtue of wraparound of solder. When the joint portion in the second electrode layer to the first electrode layer is rounded (or curved), the solder adequately flows as far as a region corresponding to a boundary part between the first electrode layer and the second electrode layer. For this reason, solder wettability to the external electrode becomes improved to further increase the contact area between the external electrode and solder. As a consequence of this improvement, the adhesion strength is enhanced between the electronic component and the circuit board. Furthermore, since the present invention adopts the configuration wherein the electronic component comprises the plurality of external electrodes and wherein the apical surface of the second electrode layer of each external electrode is planer, the electronic component is mounted on the circuit board in a state in which the external electrodes are stably loaded on the conductors of the circuit board.

Preferably, a joint portion in the first electrode layer to the element body is rounded. In this case, the solder adequately flows as far as a region corresponding to a boundary part between the first electrode layer and the element body during mounting the electronic component onto the circuit board with solder, which further increases the contact area between the external electrode and solder. This leads to a further increase in the adhesion strength between the electronic component and the circuit board.

Preferably, the first electrode layer contains a glass component and the second electrode layer contains no glass component. When the first electrode layer contains the glass component, the joint strength is enhanced between the element body and the first electrode layer with solder. When the second electrode layer contains no glass component, high electrical conductivity of the second electrode layer is sufficiently ensured. Furthermore, no glass component impedes the malleability of metal forming the second electrode layer, whereby the malleability of the second electrode layer becomes higher than that of the first electrode layer. For this reason, particularly, in a case where the second electrode layer is thicker than the first electrode layer, if the circuit board is subjected to an impact, the second electrode layer will absorb impact stress, whereby an interface will be less likely to crack between the element body and the first electrode layer.

Preferably, the first electrode layer is formed by printing with an electrode paste and the second electrode layer is formed by attaching an electrode sheet. In this case, the second electrode layer with the planar apical surface can be readily and surely formed.

The present invention improves the adhesion strength between the electronic component and the circuit board in a mounted state of the electronic component on the circuit board and prevents degradation of characteristics and the like.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference symbols, without redundant description.

Figure 1:
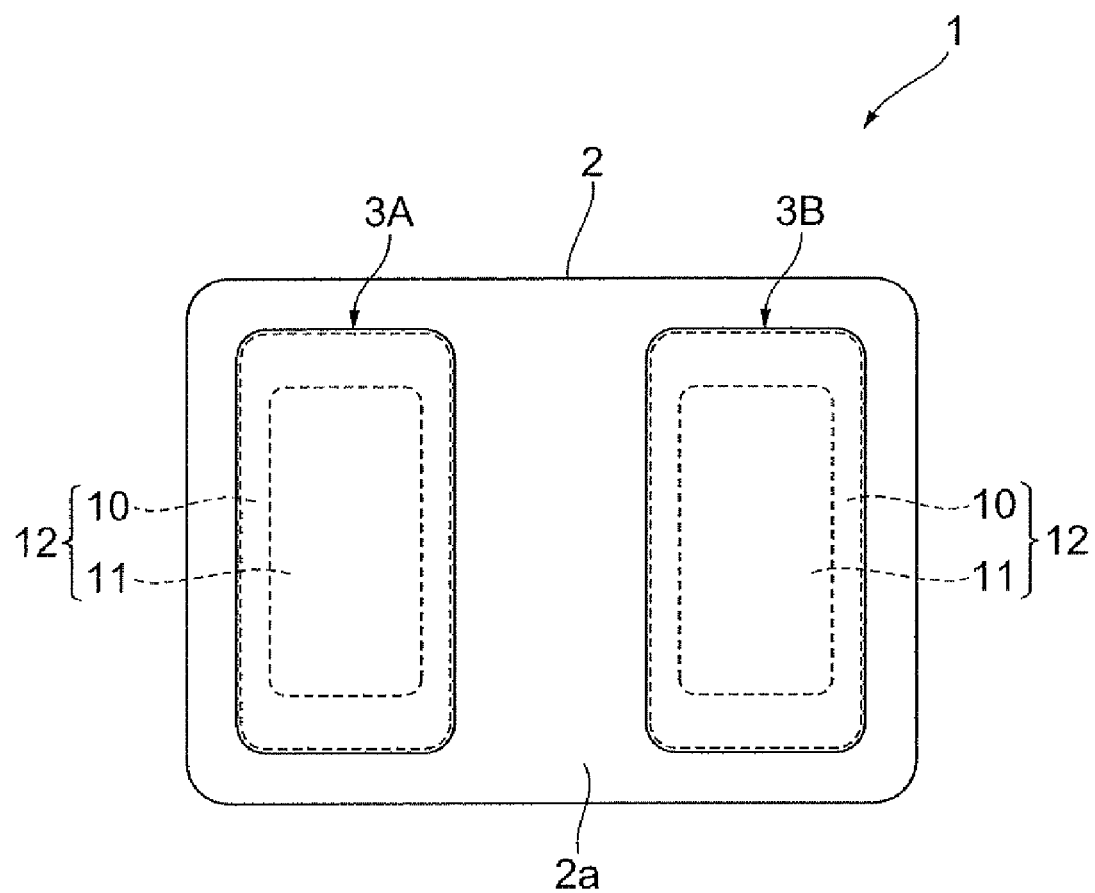
FIG. 1 is a plan view showing a chip varistor as an embodiment of the electronic component according to the present invention.
Figure 2:
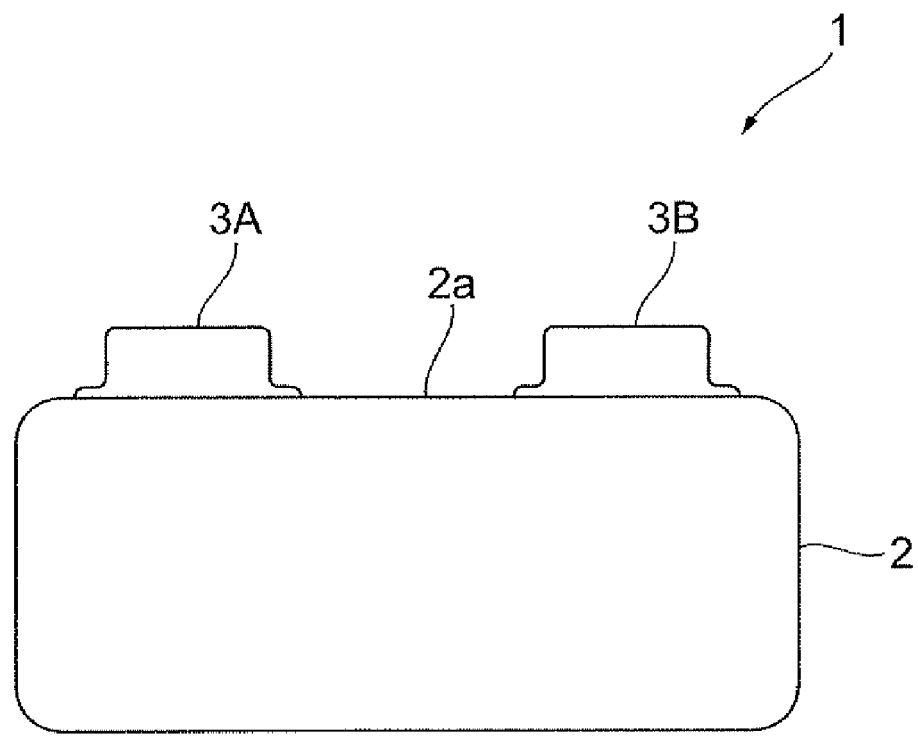
FIG. 2 is a side view of the chip varistor shown in FIG. 1.

FIG. 1 is a plan view showing a chip varistor as an embodiment of the electronic component according to the present invention and FIG. 2 a side view of the chip varistor shown in FIG. 1. In each drawing, the chip varistor 1 is a flip chip varistor of a bottom electrode type.

The chip varistor 1 has a chip element body 2 of a nearly rectangular parallelepiped shape, and external electrodes 3A, 3B formed on one principal surface 2a of this chip element body 2. The size of the chip element body 2 is, for example, approximately 0.5 mm×0.7 mm×0.3 mm.

Figure 3:
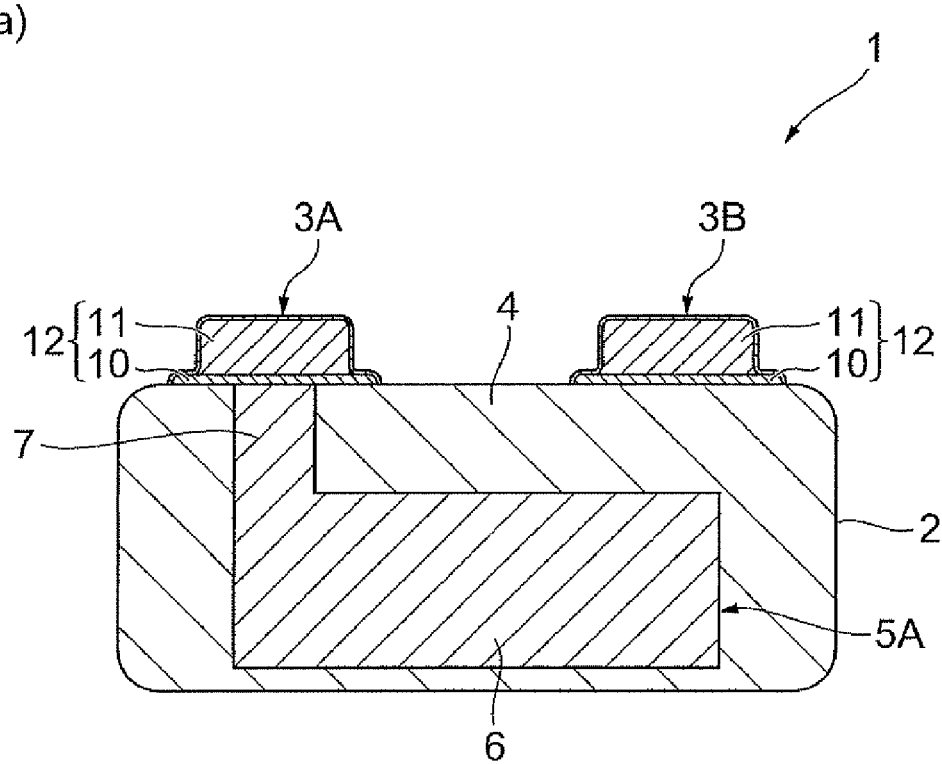
FIG. 3 is sectional views of the chip varistor shown in FIGS. 1 and 2.
Figure 3:
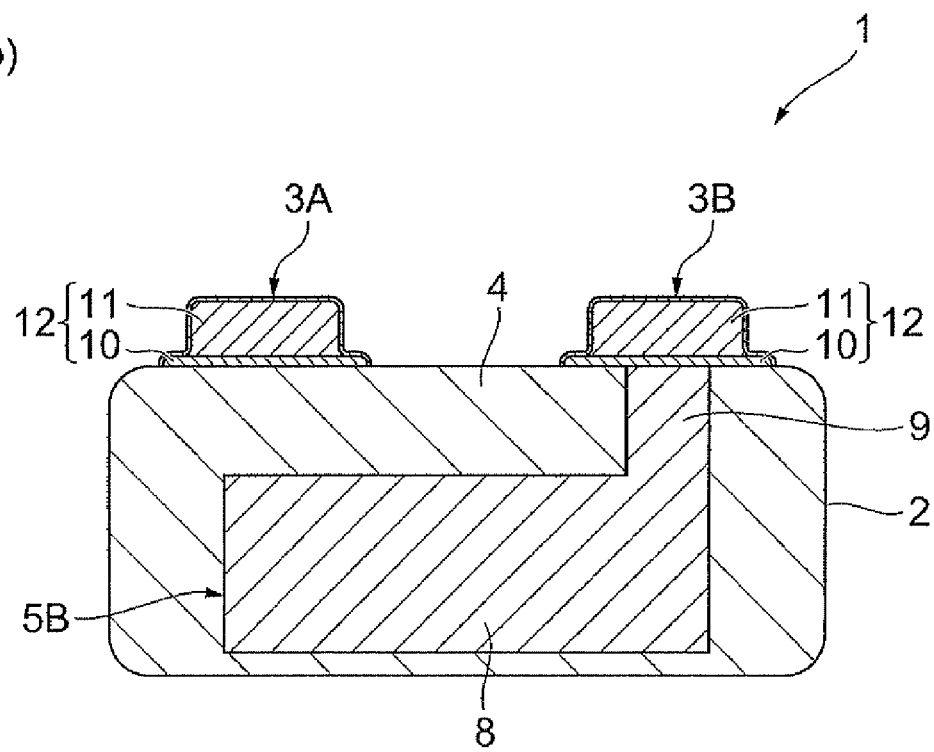

The chip element body 2, as shown in FIG. 3, is a laminate in which varistor layer 4 to exhibit the nonlinear voltage-current characteristics (which will also be referred to as the varistor property), and internal electrodes 5A, 5B are stacked in a lateral direction. The internal electrodes 5A and 5B are alternately laminated with the varistor layer 4 in between.

The varistor layer 4 contains, for example, ZnO as a major component and further contains single metals such as rare-earth metal elements, Co, IIIb elements (B, Al, Ga, In), Si, Cr, Mo, alkali metal elements (K, Rb, Cs), and alkaline-earth metal elements (Mg, Ca, Sr, Ba), and/or oxides thereof.

The internal electrode 5A has a main electrode portion 6, and a lead electrode portion 7 led out from the main electrode portion 6 so as to be exposed on one end side of the principal face 2a of the chip element body 2. The internal electrode 5B has a main electrode portion 8, and a lead electrode portion 9 led out from the main electrode portion 8 so as to be exposed on the other end side of the principal face 2a of the chip element body 2. The main electrode portions 6, 8 are superposed in the laminate direction of the chip element body 2. Consequently, the region in the varistor layer 4 between the main electrode portions 6, 8 functions as a region to exhibit the varistor property. The internal electrodes 5A, 5B are made of an electroconductive material, e.g., Pd, an Ag/Pd alloy, or the like.

The external electrode 3A is formed on the one end side of the principal face 2a of the chip element body 2 so as to be electrically connected to the lead electrode portion 7 of the internal electrode 5A. The external electrode 3B is formed on the other end side of the principal face 2a of the chip element body 2 so as to be electrically connected to the lead electrode portion of the internal electrode 5B.

Figure 4:
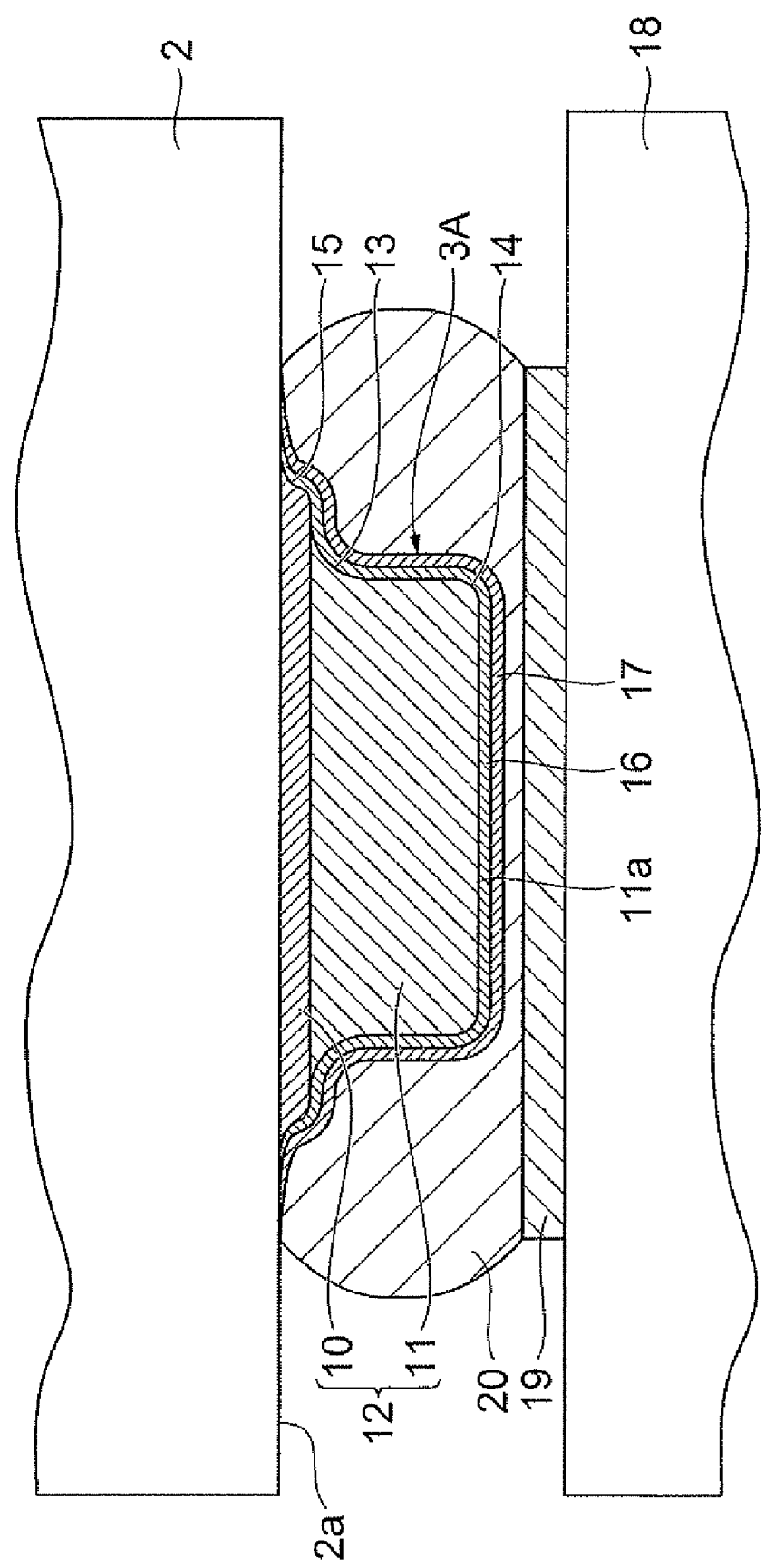
FIG. 4 is an enlarged sectional view showing a state in which an external electrode as shown in FIGS. 1 to 3 is joined to a conductor on a circuit board.

Each of the external electrodes 3A, 3B, as shown in FIGS. 1, 3, and 4, has a first electrode layer 10 of a nearly rectangular shape joined to the principal face 2a of the chip element body 2, and a second electrode layer 11 of a nearly rectangular shape joined to this first electrode layer 10. These first electrode layer 10 and second electrode layer 11 constitute an electrode body portion 12.

The second electrode layer 11 is joined as laid on an inside region inside an edge of the first electrode layer 10 when viewed from the side of the principal face 2a of the chip element body 2. Namely, the lengths (longitudinal and transverse dimensions) of the second electrode layer 11 are smaller than those of the first electrode layer 10. The second electrode layer 11 is thicker than the first electrode layer 10. In this connection, the thickness of the second electrode layer 11 is desirably three to ten times larger than that of the first electrode layer 10.

The first electrode layer 10 and the second electrode layer 11 are made, for example, of an electroconductive material such as Ag, an Ag/Pd alloy, Pt, or Cu. The first electrode layer 10 contains, for example, borosilicate type glass such as zinc borosilicate glass. This enhances adhesive strength between the chip element body 2 and the first electrode layer 10. The second electrode layer 11 contains no such glass component so as to ensure sufficient electrical conductivity.

A rounded portion 13 spreading out toward the outside (edge) of the first electrode layer 10 is provided in a joint portion (boundary portion) in the second electrode layer 11 to the first electrode layer 10. The rounded portion 13 is formed throughout the entire circumference of the second electrode layer 11.

An apical surface 11a of the second electrode layer 11 is planar. A rounded portion 14 is provided in the entire edge of the apical surface of the second electrode layer 11.

A rounded portion 15 spreading out toward the outside of the chip element body 2 is provided in a joint portion (boundary portion) in the first electrode layer 10 to the chip element body 2. The rounded portion 15 is formed throughout the entire circumference of the first electrode layer 10.

The first electrode layer 10 is formed, for example, by a printing method such as screen printing. This method allows us to readily form the rounded portion 15 in the first electrode layer 10.

The second electrode layer 11 is formed with an electrode sheet prepared in advance. The electrode sheet is obtained, for example, by applying an electrode paste onto PET film, drying it, peeling the PET film, and cutting the resultant sheet in predetermined shape and size. When the second electrode layer 11 is formed using the electrode sheet, it is easy to make the apical surface of the second electrode layer 11 planar.

A nickel (Ni) plated layer 16 is formed on the surface of the electrode body portion 12 composed of the first electrode layer 10 and the second electrode layer 11 as described above, and a tin (Sn) plated layer 17 is further formed on the surface of the Ni plated layer 16. In this configuration, portions corresponding to the aforementioned rounded portions 13-15 in the surface of the outermost Sn plated layer 17 are shaped while maintaining the rounded shape (curved shape) of the rounded portions 13-15.

Now, let us explain steps of producing the above-described chip varistor 1. First, the chip element body 2 is fabricated as described below.

Specifically, a varistor material is prepared by mixing ZnO and trace additives and then an organic binder, an organic solvent, an organic plasticizer, and others are added in this varistor material, followed by mixing and pulverization to obtain a slurry. Then the slurry is applied onto PET film by the doctor blade method or the like and dried to form membranes. Thereafter, the membranes are peeled off from the PET film to obtain ceramic green sheets.

Subsequently, an electroconductive paste obtained by mixing a metal powder, an organic binder, and an organic solvent is printed on the surface of the ceramic sheets by screen printing or the like and dried to form conductor patterns. Then the ceramic green sheets with the conductor patterns printed thereon and ceramic green sheets without printing of the conductor patterns are laminated in a predetermined order to form a laminate body.

Next, the laminate body is cut in a predetermined size and then subjected to debindering, followed by firing thereof to obtain the chip element body 2 consisting of the aforementioned varistor layer 4 and internal electrodes 5A, 5B.

Thereafter, the external electrodes 3A, 3B are formed on one principal surface 2a of the chip element body 2. Specifically, an electroconductive paste of Ag or the like is applied onto regions where the internal electrodes 5A, 5B are exposed in the principal surface 2a of the chip element body 2, by screen printing or the like to form two first electrode layers 10. When the first electrode layers 10 are formed by the printing method as described above, the aforementioned rounded portion 15 is naturally formed in the portions of the first electrode layers 10 near the chip element body 2. This eliminates a need for performing a separate process of forming the rounded portions in the first electrode layers 10.

In the next step, while the first electrode layers 10 (electroconductive paste) are in an undried state, the prepared electrode sheet (described above) is stuck onto the surfaces of the first electrode layers 10 to form the second electrode layers 11 on the first electrode layers 10. At this time, the electrode sheet is stuck so as to expose the edge of the first electrode layers 10.

Subsequently, the first electrode layers 10 and the second electrode layers 11 are dried and then sintered. This process results in decreasing the thicknesses of the first electrode layers 10 and the second electrode layers 11. For example, the thickness of the first electrode layers 10 before the firing is approximately 10-30 µm and the thickness of the first electrode layers 10 after the firing approximately 5-15 µm. The thickness of the second electrode layers 11 before the firing is approximately 100-150 µm and the thickness of the second electrode layers 11 after the firing approximately 50-75 µm. The firing of the second electrode layers 11 results in naturally forming the rounded portions 14 in the edge of the apical surfaces of the second electrode layers 11.

Next, the rounded portions 13 are formed in the portions of the second electrode layers 11 near the first electrode layers 10, for example, by barrel polishing.

Thereafter, the electrode body portions each consisting of the first electrode layer 10 and the second electrode layer 11 are subjected to electroplating to form the Ni plated layer 16 and the Sn plated layer 17 in order on the surfaces of the electrode body portions 12. The chip varistor 1 is obtained through the above steps.

When the chip varistor 1 as described above is mounted on a circuit board, the chip varistor 1 is arranged as opposed to the circuit board 18 with the principal face 2a of the chip element body 2 down as shown in FIG. 4 and in that state the external electrodes 3A, 3B of the chip varistor 1 are joined to corresponding conductors 19 on a mounting surface of the circuit board 18 with solder 20.

Since the second electrode layers 11 in the external electrodes 3A, 3B are located in the inside regions inside the edge of the first electrode layers 10, the contact area between the external electrodes 3A, 3B and solder 20 is increased by wraparound of the solder 20. This enhances the joint strength between the external electrodes 3A, 3B and the conductors 19.

Since the rounded portion 13 spreading out toward the first electrode layer 10 is formed in the joint portion in each second electrode layer 11 to the first electrode layer 10, the solder 20 adequately flows as far as the portions corresponding to the rounded portions 13 in the surfaces of the external electrodes 3A, 3B. Since the rounded portion 15 spreading out toward the chip element body 2 is formed in the joint portion in each first electrode layer 10 to the chip element body 2, the solder 20 also adequately flows as far as the portions corresponding to the rounded portions 15 in the surfaces of the external electrodes 3A, 3B. Since the solder 20 fully wraps around the entire surfaces of the external electrodes 3A, 3B as described above, wettability of solder 20 to the external electrodes 3A, 3B is improved thereby. Therefore, the contact area is further increased between the external electrodes 3A, 3B and the solder 20, so as to further enhance the joint strength between the external electrodes 3A, 3B and the conductors 19.

Since the apical surfaces (bottom surfaces) 11a of the second electrode layers 11 are planar, the apical surfaces of the external electrodes 3A, 3B are also planar. For this reason, stability is improved when the external electrodes 3A, 3B are mounted on the corresponding conductors 19 in a state in which the solder 20 is placed on the conductors 19.

Since the second electrode layers 11 contain no glass component, no glass component impedes the intrinsic malleability of metal of the second electrode layers 11, whereby the malleability of the second electrode layers 11 themselves is sufficiently ensured. In addition to it, since the second electrode layers 11 are thicker than the first electrode layers 10, they undertake a role as stress absorbing layers. Namely, even if an impact is exerted on the circuit board 18 in the mounted state of the chip varistor 1 on the circuit board 18, the second electrode layers 11 will absorb the impact stress, whereby the interface will be prevented from cracking between the external electrodes 3A, 3B and the chip element body 2.

The present invention is by no means limited to the above-described embodiment. For example, the above embodiment showed the method of forming the second electrode layers 11 of the external electrodes 3A, 3B by use of the electrode sheet, but the second electrode layers 11 may be formed by any other technique as long as the apical surfaces 11a of the second electrode layers 11 can be made planar.

The above embodiment adopted the configuration wherein the first electrode layers 10 contained the glass component and wherein the second electrode layers 11 contained no glass component, but, without having to be limited only to this configuration, it is also possible to adopt a configuration wherein the first electrode layers 10 contain no glass component, or a configuration wherein the second electrode layers 11 contain a glass component.

Furthermore, the electronic component of the above embodiment was the chip varistor, and the present invention is also applicable to any electronic component in which a plurality of external electrodes are formed on one principal face of an element body.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:
1. An electronic component comprising:
an element body; and
a plurality of external electrodes formed on one principal face of the element body,
wherein each of the external electrodes has a first electrode layer directly joined to the one principal face of the element body, and a second electrode layer joined as laid along an entire circumferential portion on an inside region inside an edge of the first electrode layer in a cross-sectional view perpendicular to the one principal face,
wherein an apical surface of each of the second electrode layers is planar, and
wherein a joint portion at a circumferential boundary at a base of each of the second electrode layers rounded.
2. The electronic component according to claim 1,
wherein a joint portion in the first electrode layer to the element body is rounded.
3. The electronic component according to claim 1,
wherein the first electrode layer contains a glass component, and
wherein the second electrode layer contains no glass component.
4. The electronic component according to claim 1,
wherein the first electrode layer is formed by sintering an electrode paste, and
wherein the second electrode layer is formed by sintering an electrode sheet.

* * * * *